United States Patent [19]

Iwamuro

[11] Patent Number: 6,072,199
[45] Date of Patent: Jun. 6, 2000

[54] INSULATED GATE BIPOLAR TRANSISTOR

[75] Inventor: Noriyuki Iwamuro, Kanagawa, Japan

[73] Assignee: Fuji Electric Co., Ltd., Kawasaki, Japan

[21] Appl. No.: 08/151,055

[22] Filed: Nov. 12, 1993

Related U.S. Application Data

[63] Continuation of application No. 07/829,262, Feb. 3, 1992, abandoned.

[30] Foreign Application Priority Data

Mar. 1, 1991 [JP] Japan ..................................... 3-034857

[51] Int. Cl.[7] ........................... H01L 29/74; H01L 31/111
[52] U.S. Cl. ............................................. 257/139; 257/147
[58] Field of Search ............................. 357/23.4, 38, 39, 357/37; 257/139, 138, 147, 148

[56] References Cited

U.S. PATENT DOCUMENTS

| | | | |
|---|---|---|---|
| 4,782,372 | 11/1988 | Nakagawa et al. | 357/23.4 |
| 5,031,009 | 7/1991 | Fujihira | 357/23.4 |
| 5,237,183 | 8/1993 | Fay et al. | 257/139 |

FOREIGN PATENT DOCUMENTS

| | | |
|---|---|---|
| 0 330 122 A1 | 8/1989 | European Pat. Off. . |
| 0330122 | 8/1989 | European Pat. Off. . |

OTHER PUBLICATIONS

Laska, et al., "A 2000 V–Non–Punch–Through–IGBT with Dynamical Properties Like a 1000 V–IGBT" International Electron Devices Meeting, Dec. 21, 1993.

Laska et al; "A 2000 V. non–punchthrough IGBT with dynamical properties like a 1000 v –IGBT" IEDM, Dec. 9, 1990.

Laska et al; "A 2000 v, non–punch through IGBT with dynamical properties like a 1000 v IGBT" IEDM, Dec. 9, 1990.

*Primary Examiner*—Wael Fahmy
*Attorney, Agent, or Firm*—Finnegan, Henderson, Farabow, Garrett & Dunner, L.L.P.

[57] ABSTRACT

A insulated gate bipolar transistor comprising a semiconductor substrate layer having an impurity concentration of not less than $4.0 \times 10^{13}/cm^3$, and being substantially free of lifetime killers.

5 Claims, 2 Drawing Sheets

○ ROOM TEMPERATURE - NO LIFETIME CONTROL
● HIGH TEMPERATURE (125°C) - NO LIFETIME CONTROL
× HIGH TEMPERATURE (125°C) - LIFETIME CONTROL

INSULATED GATE BIPOLAR TRANSISTOR

This is a continuation of application Ser. No. 07/829,262 filed Feb. 3, 1992, now abandoned.

BACKGROUND OF THE INVENTION

1. Field of the Invention

The present invention relates to an insulated gate bipolar transistor (herein called "IGBT") for use as a power switching element and to a process of producing the same.

2. Discussion of the Related Art

Current applications increasingly use IGBTs as power switching elements. In such applications, an IGBT is typically formed, for example, by adding a p$^+$ layer to the drain electrode side of a drain region in an n-channel vertical type MOSFET. Specifically, as shown in the cell depicted in FIG. 2, the process of forming the cell comprises the steps of epitaxially forming a low-resistance n$^+$ layer 2 on one side of a p$^+$ silicon substrate 1, laying a high-resistance n$^-$ layer 3 on the surface of the n$^+$ layer 2, selectively forming a p$^+$ layer 4 in a surface portion of the n$^-$ layer 3, selectively forming an n$^+$ layer 5 in a surface portion of p$^+$ layer 4, forming a gate electrode 7 and connecting it to a gate terminal G, gate electrode 7 being formed over a gate insulating film 6 on a surface region 41 of p$^+$ layer 4 which acts as a channel region, surface region 41 being disposed between n$^-$ layer 3 and n$^+$ layer 5, forming a source electrode 8 over an insulating film 10, source electrode 8 being connected to a source terminal S and formed in common contact with p$^+$ layer 4 and n$^+$ layer 5, and further disposing a drain electrode 9 on the other side of p$^+$ substrate 1, drain electrode 9 being connected to a drain terminal D.

When a positive voltage is applied to gate terminal G and drain terminal D while source terminal S is grounded, the MOSFET constituted by n$^+$ layer 2, n$^-$ layer 3, p$^+$ layer 4, n$^+$ layer 5, gate electrode 7, source electrode 8 and the like is turned ON and electrons flow into n$^-$ layer 3 through the channel region 41. A corresponding hole injection in response to the influx of electrons into n$^-$ layer 3 is induced from p$^+$ substrate 1 through n$^+$ layer 2. Conductivity modulation, thus, occurs in n$^-$ layer 3 and the localized resistance decreases, thus developing a low resistance "ON" characteristic.

Recently, applications have arisen which require an IGBT with decreased turn-OFF losses for use at high operating frequencies. Attempts have been made to shorten turn-OFF lifetime and thereby reduce turn-OFF losses by introducing a lifetime killer. However, the benefits of introducing a lifetime killer are not without corresponding drawbacks. For example, one tradeoff characteristic which arises from the introduction of a lifetime killer is an increase in the ON-state voltage of the switching element. This and other tradeoff characteristics largely depend on the thickness of the n$^-$ layer 3. IGBT shown in FIG. 2 is often referred to as a punch-through type since n$^+$ layer 2 is used as a buffer layer which acts as a depletion layer stopper. Thus, in a conventional punch-through IGBT, the thickness of n$^-$ layer 3 is reduced to improve the tradeoff characteristics.

Conventional IGBTs are costly to manufacture because an epitaxial wafer must be employed. If a relatively inexpensive wafer is employed, such as one prepared from a silicon monocrystal under the FZ (Floating zone) process the reduction of wafer thickness is limited because of difficulties in handling thin wafers during the manufacturing process.

In the FZ method, a high-purity polycrystalline rod with a seed crystal at the bottom is held in a vertical position and rotated. The rod is enclosed in a quartz envelope within which an inert atmosphere (argon) is maintained. During the operation, a small zone (a few centimeters in length) of the crystal is kept molten by a radio-frequency heater, which is moved upward from the seed so that the molten zone (floating zone) traverses the length of the rod. The molten silicon is retained by the surface tension between the melting and growing solid silicon faces. As the floating zone moves upward, a single crystal silicon freezes at the zone's retreating end and grows as an extension of the seed crystal.

Consequently, it has not been feasible to simultaneously lower ON-state voltage and reduce turn-OFF loss in a switching element fabricated from non-epitaxal wafer.

SUMMARY OF THE INVENTION

The present invention has been made in view of the above circumstances and has as an object to provide an IGBT capable of implementing both low ON-state voltage and reduced turn-OFF loss in a semiconductor element having a relatively thick n$^-$ layer 3 as in the case of FIG. 2.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve these objects and in accordance with the purpose of the invention, as embodied and broadly described herein, the semiconductor device of this invention comprises a substrate of first conductivity type having an impurity concentration of not less than $4.0 \times 10^{13}/cm^3$, wherein the substrate is substantially free of lifetime killers, a first region of second conductivity type selectively formed in a first surface of the substrate, a second region of first conductivity type selectively formed in the first region such that a channel region is formed between the second region and the substrate through the first region, an insulating film disposed on the first surface of the substrate over the channel region, a gate electrode disposed on the insulating film, a source electrode disposed on the first surface of the substrate in contact with the first and second region, a layer region of second conductivity type formed in an opposite second surface of the substrate; and a drain electrode in contact with said layer region.

In another aspect the present invention comprises a method of producing an insulated gate bipolar transistor comprising the steps of providing a semiconductor substrate of first conductive type having an impurity concentration of not less than $4.0 \times 10^{13}/cm^3$ and being substantially free of lifetime killers, forming a gate electrode by patterning a conductive layer formed on a first surface of the semiconductor substrate via an insulating film, introducing impurities of one type selectively into the first surface of the semiconductor substrate using the gate electrode as a mask, and into an entire opposite second surface of the semiconductor substrate, forming a first region of a second conductive type in the first surface of the semiconductor substrate and a layer region of the second conductive type on the opposite second surface by thermal diffusion of the impurities, introducing impurities of another type selectively into the surface of the first region using the gate electrode as a mask, forming a second region of the first conductive type selectively in the surface layer of the first region by thermal diffusion of the impurities of another type, forming a source electrode in contact with the surfaces of the first and second regions on the first side of the semiconductor substrate, and forming a drain electrode in contact with the layer region.

BRIEF DESCRIPTION OF THE DRAWINGS

The accompanying drawings, which are incorporated in and constitute a part of this specification illustrate a preferred embodiment of the present invention and, together with the description, serve to explain the objects, advantages, and principles of the invention.

In the drawings.

DESCRIPTION OF THE PREFERRED EMBODIMENT

Figure 1:
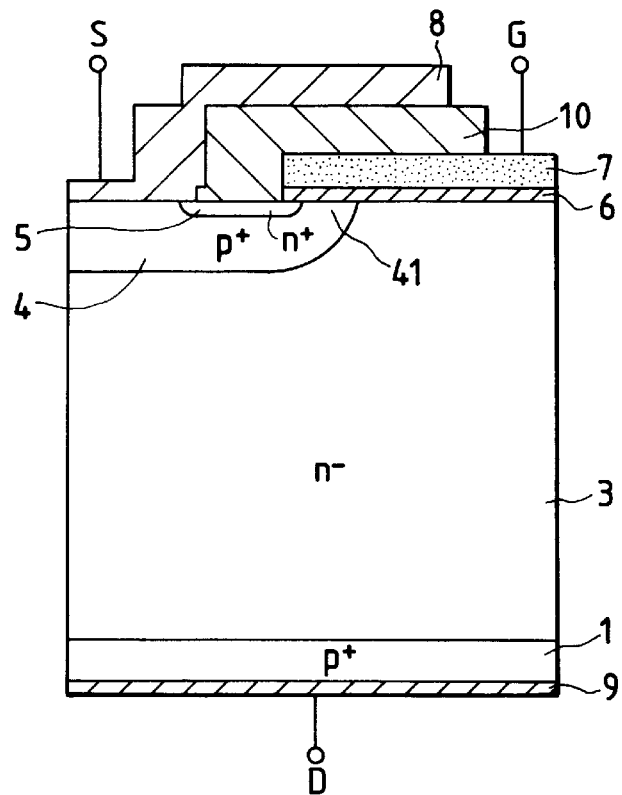
FIG. 1 is a sectional view of an IGBT embodying the present invention.
Figure 2:
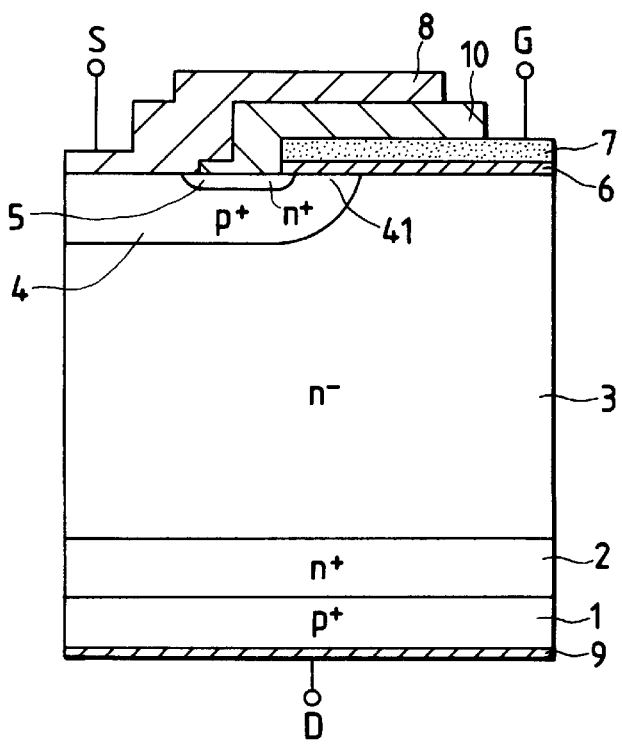
FIG. 2 is a sectional view of a conventional punch-through type IGBT.

FIG. 1 illustrates a semiconductor element embodying the present invention, wherein like reference characters designate like or corresponding parts as in FIG. 2. This semiconductor element comprises an n⁻ semiconductor substrate layer 3 having p⁺ layer 1 (layer region) formed in a opposite second surface with respect to a p⁺ (first) region 4 selectively formed in a first surface of the semiconductor substrate. An n⁺ (second) region 5 is selectively formed in the p⁺ region 4 such that a channel region 41 is formed. A gate electrode 7 is provided via an insulating film 6 on the first surface of n⁻ semiconductor substrate 3 such that it commonly overlays end portions of p⁺ region 4 and n⁺ region 5, that is, the channel region 41. A source electrode 8 is also provided on the first surface of the n⁻ semiconductor substrate 3 via insulating film 10 and commonly contacts n⁺ region 5 and p⁺ region 4. A drain electrode 9 contacts p⁺ layer region 1.

The semiconductor element thus constructed is not subjected to lifetime control processing. Additionally, the impurity concentration of n⁻ semiconductor substrate 3 is not lower than $4.0 \times 10^{13}/cm^3$. Accordingly, a depletion layer is in effect prevented from spreading after drain voltage clamping in an inverter circuit, for instance. As a result, a so-called tail current will not virtually flow. It is therefore possible to lower turn-OFF loss without lifetime control.

As the lifetime control processing is not performed, ON-state voltage can be lowered without making n⁻ semiconductor substrate 3 thinner by means of a buffer layer. The deterioration of tradeoff characteristics at high temperatures is thus prevented. Finally, since an additional n⁺ layer (layer 2 in FIG. 2) can be dispensed with, a semiconductor substrate having a substantially uniform impurity concentration of not less than $4.0 \times 10^{13}/cm^3$ is usable for producing a bipolar transistor without using an epitaxial wafer.

The semiconductor element described above is produced by the following steps. One side of an n⁻ silicon substrate cut from a monocrystal prepared under the FZ process is covered with polycrystalline silicon via an oxide film. A gate electrode 7 and a gate oxide film 6 made of polycrystalline silicon are formed by photolithography and acceptor ions are injected into a first surface of the substrate with the gate electrode 7 as a mask. The acceptor ions are also injected from the opposite second side of the substrate, and a p⁺ layer region 1 and a p⁺ first region 4 are simultaneously formed by thermal diffusion. A portion of the n⁻ substrate between the formation of the respective p⁺ layers is retained as an n⁻ substrate layer 3.

Subsequently, an n⁺ second region 5 is formed by donor ion injection and thermal diffusion with the gate electrode 7 acting in part as a mask. A source electrode 8 is formed in contact with the p⁺ first region 4 and the n⁺ second region 5 through an insulating film 10 and a drain electrode 9 is connected to the p⁺ layer region 1 to complete the IGBT. No lifetime killer is introduced.

The exemplary semiconductor element cell shown in FIG. 1 may have a width of 20 μm and a plurality of such cells may be formed on a substrate 8 mm square. The n⁻ layer 3 is preferably 220 μm thick, and $x_j$ of p⁺ layer 1 is preferably 2 μm, the surface impurity concentration is preferably $6.0 \times 10^{15}/cm^3$. In this case, the ON-state voltage is 2.0 V when I=50 A/cm². $x_j$ is a junction depth from the surface.

Figure 3:
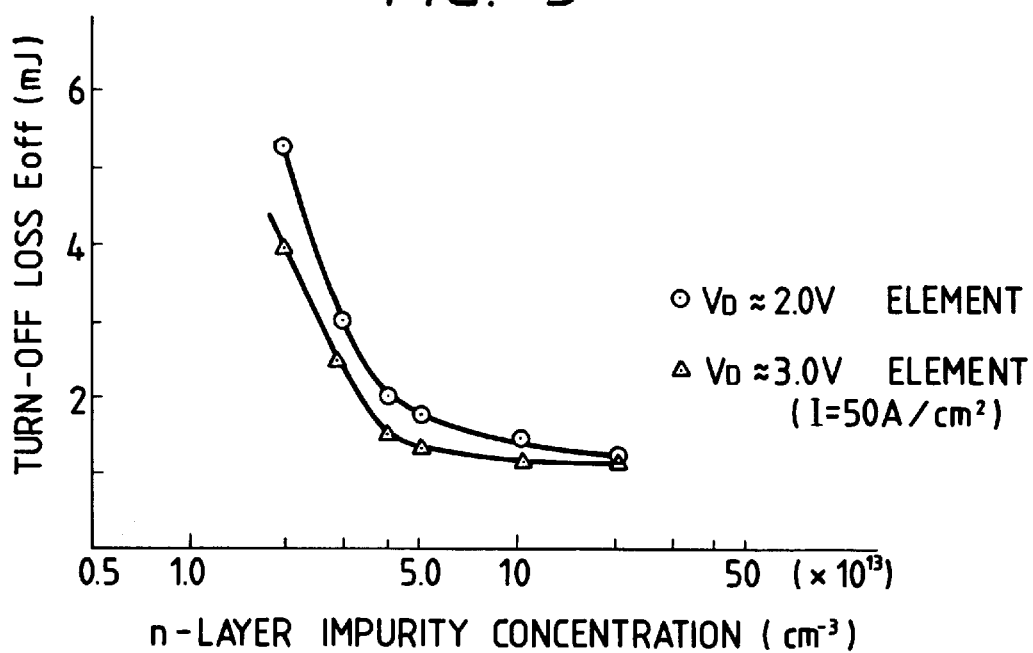
FIG. 3 is a diagram illustrating the relationship between turn-OFF loss and impurity concentration in the n⁻ layer of the IGBT constructed as shown in FIG. 1.

FIG. 3 illustrates the relationship between the turn-OFF loss and the specific resistance of n⁻ layer 3 in the semiconductor element of the present invention. During evaluation of the present invention, an element having an ON-state voltage of close to 3.0 V when I=50 A/cm² was formed by varying the thickness of n⁻ substrate layer 3. In any one of the test cases, $E_{off}$ measurement was made in an inverter circuit whose clamp voltage was 600 V.

As is apparent from FIG. 3, $E_{off}$ sharply increases when the impurity concentration of n⁻ substrate layer 3 becomes lower than $4.0 \times 10^{13}/cm^3$ in the elements whose ON-state voltages are 2.0 V and 3.0 V, respectively.

Subsequently, an n⁻ silicon substrate having an impurity concentration of $2 \times 10^{14}/cm^3$ was used to produce elements using the steps described above with the additional step of introducing a lifetime killer. Elements having ON-state voltages close to 2.0 V, 2.5 V, and 3.0 V, were produced by varying the thickness of n⁻ substrate layer 3 before being tested at room temperature and at high temperature (125° C.).

Figure 4:
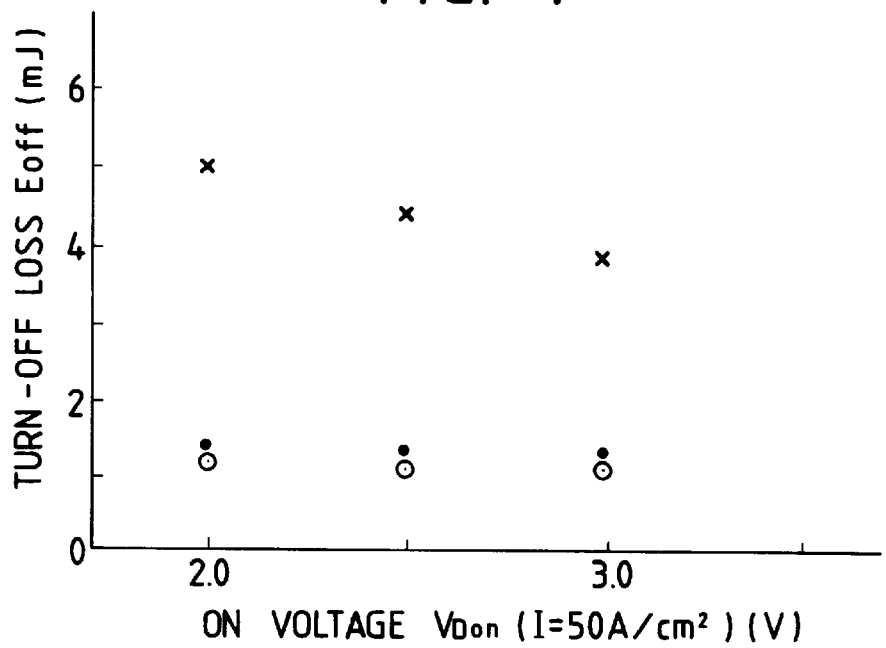
FIG. 4 is a plot illustrating the turn-OFF loss/ON-state voltage tradeoff characteristics at room and high temperatures in the presence and absence of lifetime killer in the IGBT constructed as shown in FIG. 1.

FIG. 4 shows ON-state voltage and $E_{off}$ tradeoff characteristics both with and without a lifetime killer. As is apparent from FIG. 4, the tradeoff characteristics deteriorate as the lifetime killer becomes ineffective at high temperature in the case of the element with the lifetime killer thus introduced, whereas in the case of the element without the lifetime killer, the characteristics are free from deterioration even at high temperatures.

A n⁺ buffer layer 2 may be formed between p⁺ layer region 1 and n⁻ substrate layer 3 to control conductivity modulation. The present invention is applicable not only to n-channel IGBTs described above but also to p-channel IGBTs in which the conductivity type of each layer is reversed.

As set forth above, the impurity concentration of the low impurity concentration layer of the IGBT is set to not lower than $4.0 \times 10^{13}/cm^3$, whereby the turn-OFF loss is lowered without the lifetime control and a low ON-state voltage becomes available though it is not of the punch-through type even when the low impurity concentration layer is thick. It is therefore possible to produce IGBT of low ON-state voltage and low turn-OFF loss using an inexpensive semiconductor substrate as raw material like the wafer prepared under the FZ process.

The foregoing description of preferred embodiments of the invention has been presented for purpose of illustration and description. It is not intended to be exhaustive or to limit the invention to the precise form disclosed, and modifications and variations are possible in light of the above teachings or may be acquired from practice of the invention. The embodiments were shown and described in order to explain the principles of the invention and its practical application to enable one skilled in the art or utilize the invention in various embodiments and with various modifications as are suited to the particular use contemplate. It is intended that the scope of the invention be defined by the claims appended hereto, and their equivalents.

What is claimed is:

1. A semiconductor element, comprising:
    a substrate of first conductivity type having an impurity concentration of not less than $4.0 \times 10^{13}/cm^3$, said substrate being produced from a single silicon crystal prepared by a zone melting method and substantially free of lifetime killers;
    a first diffused region of second conductivity type in a first surface of the substrate;
    a second diffused region of first conductivity type in the first region such that a channel region is formed between the second region and the substrate through the first region;
    an insulating film on the first surface of the substrate over the channel region;
    a gate electrode on the insulating film;
    a source electrode on the first surface of the substrate in contact with the first and second regions;
    a third diffused region of second conductivity type formed in an opposite second surface of the substrate and having a depth of at least 2 microns; and
    a drain electrode in contact with said third region.

2. The semiconductor element according to claim 1, comprising a high impurity concentration buffer fourth diffused region of first conductivity type in the substrate beyond and adjacent to the third region.

3. The semiconductor element according to claim 1, wherein the zone melting method is a floating zone melting process.

4. The semiconductor element according to claim 1, wherein the substrate is approximately 200 microns thick.

5. An insulated gate bipolar transistor comprising:
    a semiconductor substrate of first conductivity type having an impurity concentration of not less than $4.0 \times 10^{13}/cm^3$, and being produced from a single silicon crystal prepared by a zone melting method and substantially free of lifetime killers; and
    a diffused region of second conductivity type formed in a surface of the substrate and having a depth of at least 2 microns.

* * * * *